(12) United States Patent
Husher

(10) Patent No.: US 7,102,167 B1
(45) Date of Patent: Sep. 5, 2006

(54) METHOD AND SYSTEM FOR PROVIDING A CMOS OUTPUT STAGE UTILIZING A BURIED POWER BUSS

(75) Inventor: John Durbin Husher, Los Altos Hills Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 193 days.

(21) Appl. No.: 10/135,999

(22) Filed: Apr. 29, 2002

(51) Int. Cl.
*H01L 27/108* (2006.01)

(52) U.S. Cl. .................. 257/69; 257/204; 257/206; 257/338; 257/350; 257/351; 257/357; 257/377; 257/508; 257/510

(58) Field of Classification Search .............. 257/69, 257/204, 206, 338, 350, 351, 357, 377, 508, 257/510
See application file for complete search history.

(56) References Cited

U.S. PATENT DOCUMENTS 5,565,697 A * 10/1996 Asakawa et al. ........... 257/347

* cited by examiner

*Primary Examiner*—Wai-Sing Louie
(74) *Attorney, Agent, or Firm*—Sawyer Law Group LLP

(57) ABSTRACT

A CMOS output stage is disclosed. The CMOS output stage comprises a substrate and at least one well coupled to the substrate. The CMOS output stage also includes a plurality of slots provided through the one well into the substrate. Each of the slots are oxidized. Each of the plurality of slots are filled with metal to provide a plurality of power busses. One of the power busses provides a ground. One of the power busses provides an output. One of the power busses provides a power connector. This results in the buried power buss metal always having oxide isolated surroundings. This feature allows all of these power busses to be established wherever necessary without causing any circuit issues since they are always insulated from other areas of the device. One of the power busses provides a ground. One of the power busses provides an output. One of the power busses provides a power connector.

27 Claims, 2 Drawing Sheets

100

METHOD AND SYSTEM FOR PROVIDING A CMOS OUTPUT STAGE UTILIZING A BURIED POWER BUSS

FIELD OF THE INVENTION

The present invention relates generally to a CMOS device and particularly to utilizing a CMOS device as a power output stage.

BACKGROUND OF THE INVENTION

A CMOS output stage or any prior stage has certain physical and electrical limitations. Many of these limitations can be overcome with the use of a buried power buss.

Overview of Issues Limiting the CMOS

FIG. 1 is a cross-section of a conventional CMOS device 10 utilized as a power output stage. The CMOS device 10 is a dual well device P well 12 and N well 14 with appropriate N and P regions therein 16 and 18. The CMOS device 10 includes a ground 20 which is coupled to the P well 12 and the N doped section 16, a power out connection 22, an N doped region 16, the P well doped region 18 of the N doped region and a power connection 24 to the P doped region of the N well.

The connections shown to the output stage are typical of the earlier stages of a CMOS device, the main difference being the amount of current and the resultant power that this output stage carries. Because of the high current demand the output stage differs from the other stages by the W/L ratio and the resultant larger size, as well as the amount of metal used. The various metal interconnects are the inputs, ground, the power buss, and the drains of the P channel and N channel tied together forming the output. Since the output stage must carry the highest current these metal interconnects need to have a much larger cross section than the earlier stages. This is to prevent electromigration, IR drops, chip heat, and in some cases reduce the time constant presented by this metal drop and the capacitance of the load and distributed capacitance of the metal interconnect itself.

There are many issues related to providing a CMOS output stage that has adequate performance. These issues include the following:

1. The dual well has a somewhat weak point where the two wells tend to merge. This can be a leaky area or an area of low breakdown. It can have a very low field threshold.

2. The N channel device has a parasitic NPN from the drain through the P well to the epitaxial layer. This can cause problems and is mainly determined by the distance the N drain is from the edge of the P well.

3. Also, the level of positive charge in the oxide above the drain/P well area can cause the region between the N drain and the edge of the P well to have a channel that can connect the N drain to the N epitaxial layer resulting in a short drain to the epitaxial layer.

4. The P channel device has a somewhat similar issue that usually does not come into the picture. The distance from the edge of the P drain to the edge of the N well is important since a short can result to the epitaxial area. Also it has a parasitic PNP from drain through the N well to the P substrate.

5. The N channel device has a parasitic NPN bipolar device made up of the source of the N channel, the P well, and the drain of the N channel (or the N epitaxial layer). Hole current is generated in the P well by impact ionization which flows out of the source of the N channel to ground. At some point the IR drop forward biases the source/P well junction and results in injection and the resulting NPN action. This results in a voltage and current limiting bipolar snap back voltage and sustaining current.

6. Current carrying capability is determined by the thickness, width and resistivity of the metal line interconnects. Except for the inputs of the power output stage the rest of the output interconnects must normally carry the same high current. Current is limited by current density which, if exceeded, can result in electromigration issues. This is very important for the power, ground, and output of the power output stage.

7. In cases where speed is desired the resistance in the poly or metal interconnect leads can result in RC time constant limitations. This RC time constant relates to the distributed resistance capacitance of the interconnects and the capacitance of the inputs or loads the lead is connecting to.

8. Current is determined by the uCW/L of the device as well as the gate voltage that drives the device. Current can be limited by insufficient voltage on the gate due to IR drops in the interconnect to the gates.

9. Heat is generated in the output stage as a result of the high current IR heating of the metal as well as power consumption of the output stage.

10. The on resistance (Ron) of the device is determined by several physical elements of the output stage as well as some related to the device physics. The sheet resistance of the metal, the length of the metal, the resistance of the ground connection, the turn on resistance of the device as a function of the drive to the device, the channel length, the contact resistance of the drain, and the mobility of the channel.

11. The Ron times area product of the device is a figure of merit that wants this to be as low as possible for the given function to be performed.

12. The speed/power factor of the device where the highest speed is desired at the lowest power for that given function. These issues are present in dual well or single well (CMOS) devices.

Accordingly, what is needed is a system and method which overcomes the above-identified issues. The present invention addresses and resolves these issues.

SUMMARY OF THE INVENTION

A CMOS output stage is disclosed. The CMOS output stage comprises a substrate and at least one well coupled to the substrate. The CMOS output stage also includes a plurality of slots provided through the one well into the substrate. Each of the slots are oxidized. Each of the plurality of slots are filled with metal to provide a plurality of power busses. This results in the buried power buss metal always having oxide isolated surroundings. This feature allows all of these power busses to be established wherever necessary without causing any circuit issues since they are always insulated from other areas of the device. One of the power busses provides a ground. One of the power busses provides an output. One of the power busses provides a power connector. All are processed simultaneously.

DETAILED DESCRIPTION

The present invention relates generally to a CMOS device and particularly to utilizing a CMOS device as a power output stage. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

U.S. patent application Ser. No. 10/034/184, entitled "Buried Power Buss for High Current, High Power Semiconductor Devices and a Method for Providing the Same," filed in Dec. 28, 2001, and assigned to the assignee of the present application, describes a method and system for providing an interconnect on a semiconductor device. The application is incorporated in its entirety herein. The method and system comprises providing a semiconductor substrate with a plurality of device structures thereon and providing at least one slot in the semiconductor substrate. The method and system include providing a metal within the at least one slot.

The buried power buss is formed after all the active areas are formed. Slots are formed which can be approximately 5 µm wide and 5 µm deep. The slots are oxidized prior to metal deposition. In places where it is desired that the metal makes contact to the substrate, the oxide is anisotropically etched out of the bottom of those slots. Metal is then deposited that is 2.5 µm thick (Metal 1A) and removed in the field without a masking step. An additional metal is deposited (Metal 1B) and again removed in the field. This is followed by a TEOS deposition, standard contact openings and openings of he TEOS above the metal in the slots and metal is again deposited (Metal 1C). This 1C metal is then patterned to provide the interconnects. With this approach only the 1C metal needs to be patterned so it allows technology in place to be used without having to etch the very thick 7.5 µm of metal. This leaves approximately 7.5 µm of metal in the slots, and 2.5 µm (could be 1.0 µm, depending on the thickness of metal 1C) of metal in the other interconnects. This acts as a dual metal device with the power leads being determined by first (1A), second (1B) and third (1C) metal depositions and the interconnects being determined by the third metal (1C) deposition. While acting like a dual metal approach, it only has to open one contact whereas the dual metal approach has to deposit a second dielectric and etch vias (contacts). This approach results in controlled narrow metal, determined by the slot width, that is very thick without using special equipment. It eliminates several steps in the process and takes one less mask.

Figure 1:
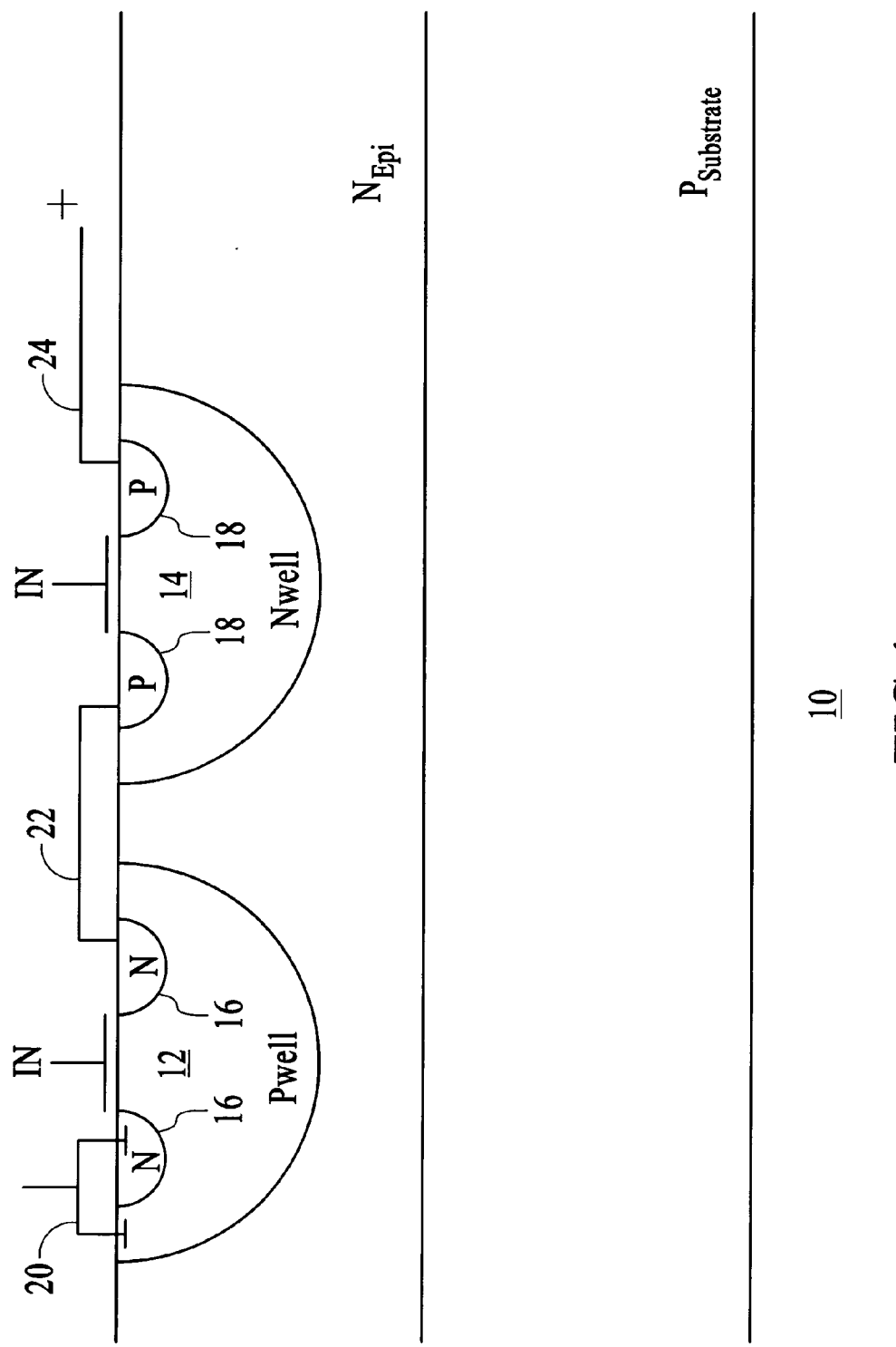
FIG. 1 is a cross-section of a conventional CMOS device utilized as a power output stage.
Figure 2:
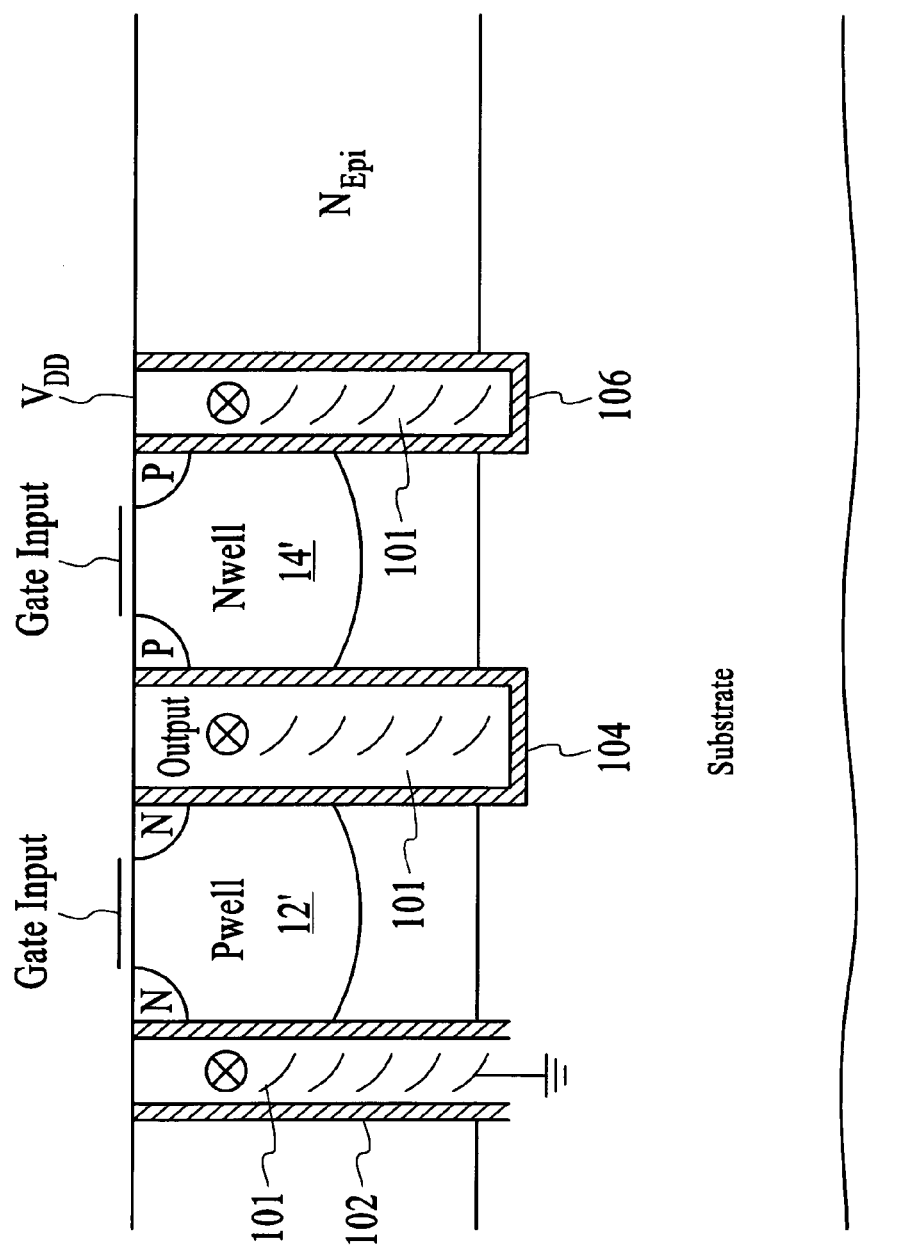
FIG. 2 is a CMOS device including a plurality of buried power busses in accordance with the present invention.

FIG. 2 is a CMOS device 100 including a plurality of buried power busses in accordance with the present invention. The CMOS device of this embodiment is a dual well device (P well 12' and N well 14'); the CMOS device includes a ground provided by metal 101 buried in an oxidized slot 102 with no oxide layer at the bottom, a second oxidized slot 104 with metal 101 is provided as output. Finally, an oxidized third slot 106 with metal 101 is utilized as $V_{dd}$. The slot 102 is provided in the outer edge of the P well and cuts through half of the Source of the CMOS. The slot 104 is provided in both the inner edge of the P well and the inner edge of the N well while cutting through the half of the drain of both the N channel and P channel. The slot 106 is provided in the outer edge of the N well while cutting off half of the source of the P channel. The cross section of these slots is shown in FIG. 3.

As shown, the slots 102, 104 and 106 are oxidized with the oxide removed from the bottom of the ground slot 102 so the metal will make good ground contact to the source, P well and substrate. This feature allows all of these power busses to be established wherever necessary without causing any circuit issues since the slot metal is always insulated from other areas of the device by the oxide in the slot or the TEOS dielectric above.

The CMOS device 100 has the following advantages:

1. The two wells can be touching each other or overlap. The buried power buss approach makes this a non issue.

2. The source and drains of the N channel and P channel can be very close to the edge of their respective wells. The buried power buss approach makes this a non issue.

3. The drains of the P channel and N channel can be very close to each other. The buried power buss approach makes this a non issue.

4. The metal interconnects do not take up additional space since they are integral within the device.

5. Due to the four conditions just mentioned, the device, for the same function, can be made very much smaller than the standard approach. This is very significant since it is true for power CMOS or high frequency low power CMOS.

6. By making the device as small as possible, including the integral parts of the function that do not come about by making the channel length shorter, results in a faster device while keeping the channel length constant.

7. The buried power buss approach allows the above steps to be taken and results in a device with the lowest Ron X area product for any given CMOS structure used in CMOS, BICMOS, DMOS, BiCMOS, all other things remaining constant.

8. This technique results in the smallest CMOS regardless of use, all other things being equal. One can take a 90 nm CMOS device and make it smaller, all other things being equal. One can take a power CMOS and make it smaller, all other things being equal. As a result of this reduction in size for all of these technologies, there are numerous advantages for each of the technologies.

The drain P channel to the drain N channel metalized slot results in the desired short between the drains of the P channel and N channel as well as providing a thick metal for the CMOS output. This means the wells will not have anything to do with limiting the breakdown or leakage. In fact, the wells could be overlapped considerably since this area is cut out with the slots and they carry their oxide insulation with them, thereby oxide isolating the drain junction of the P well from the drain junction of the N well, while shorting them together electrically. This resolves issue (1) listed above; i.e., there is no leakage to be concerned about as a result of the distance between the two wells, since the action of cutting and oxidizing the slot removes the terminating edges of the wells. The breakdown is now determined by much higher breakdown voltage of the oxide isolation.

Since the drains of the P channel and N channel, as well as the output of the device, are determined by a common buried power slot, there is no concern about the distance from the N drain to the edge of the P well. As mentioned above, one can have an NPN action from the edge of the N drain through the P well to the epitaxial area. Since the path from the N drain through the P well to the epitaxial area is now eliminated by an oxide isolated power buss, this eliminates issue (2) listed above.

Since charge in the field oxide above the N drain/P well can normally result in a channel from drain to epitaxial and the resulting short; this is eliminated by this oxide isolated metalized slot (104). This results in eliminating issue (3) listed above.

Similar issues relate to the P drain. The distance from the edge of the P drain to the edge of the N well can be too small and result in leakage or a short. This problem is overcome by the common power slot as shown since it places an oxide isolated, metalized slot between the P drain edge and the epitaxial. This relates to eliminating issue (4) above.

The breakdown voltage of the N channel normally limits the voltage capability of the device due to snap back voltage. This voltage is a function of the impact ionization and the hole current that results. This current flows along the P well and out the source to ground. Since the metalized slots shown in FIG. 3 result in the P well being truncated, as well as the source being grounded by a buried buss at the source, there is less resistance in the path of the hole current. This results in a lower IR drop and therefore one can benefit by having a higher IDS current before being limited by the parasitic NPN action. This results in higher sustaining current and snap back voltage. In most cases this voltage occurs well above the range needed for today's devices and becomes a non issue. This relates to resolving issue (5) listed above.

Since the output stage carries the highest current it is a candidate for electromigration issues. Using the buried power buss results in a very thick metal, while maintaining narrow width and ease of metal etch, which results in current density levels that are at least an order of magnitude lower than the standard metalization, thus electromigration never becomes an issue. This relates to resolving issue (6) listed above.

It is also obvious that the power buss, the output buss and the ground buss have substantial metal in the cross-sections. Because of this, the current carrying capability of the device is purely a function of the uCW/L of the device and any resistance of the metal. Using the buried power buss the connection between the N drain and P drain is a common power buss slot that is shared with the output; which is as short a connection that can be made. This results in low IR drop plus a saving of space. This resolves part of issue (6) and (8) listed above.

Where speed is desired and the resistance drop of the poly interconnects leads up to the gate are part of the limiting time constant, part of this can be reduced by replacing most of the poly by providing buried power slots up to the gate inputs. How close the metal slots approach the gates before they revert back to poly is determined by the design. This addresses issue (7) listed above. In addition, since much of the N and P wells are cut off by the slots, there is considerable reduction in capacitance that results in improved speed.

Since the buried power buss results in thick metal that is either touching silicon or oxide, it has heat transfer characteristics that are much better than standard metal. This is due to heat transfer through silicon which is an order of magnitude better than through oxide and 200 times better than through air. The ground strap is directly to silicon and the other buried power busses transfer heat via oxide and silicon resulting in heat transfer that is much better than standard. This approach results in better thermal characteristics than the more complicated and expensive damascene process using copper. This addresses issue (9) listed above.

The metalized slots shown are only representative of what can be used. Slot width can vary within the device. The experience here is that they can go from 1 µm to 8 µm on a device without much variation in depth. One can use very narrow slots in the early stages of the device, or use the last layer of metal (metal 1C) without slots for these areas where it is desired to hold the metal to dimensions such as less than half a micron.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. For shallow, high frequency devices the metalized slots can be made much smaller in width and depth consistent with the approach being used. No matter how small the dimension of the CMOS being employed this approach will result in an even smaller device.

The invention claimed is:

1. A CMOS output stage comprising:
a substrate; and
at least two wells coupled to the substrate; and
a plurality of slots provided between the at least two wells into the substrate, each of the slots being oxidized, wherein each of the plurality of slots are filled with metal to provide a plurality of power busses; wherein one of the power busses provides a ground, one of the power busses provides an output and one of the power busses provides a power connector.

2. The CMOS output stage of claim 1 wherein the ends of the at least two wells can be shortened by use of a metalized, oxidized slot to minimize the size of the output stage.

3. The CMOS output stage of claim 2 wherein the one end of the shortened stage is source grounded to the substrate by removing the oxide from the bottom of the slot prior to metalization.

4. The CMOS output stage of claim 2 wherein a supply shortened end is provided by a metalized slot to lower the resistance of the power metal while shortening the end by truncating an N well.

5. The CMOS output stage of claim 2 wherein the at least two wells are in close proximity to each other further reducing the size of the CMOS.

6. The CMOS stage of claim 2 wherein the shortening of the stage results in reduced capacitance.

7. The CMOS stage of claim 3 wherein the shortening of the stage results in reduced capacitance.

8. The CMOS output stage of claim 2 wherein two drains of an N channel and a P channel are connected via the metalized and oxidized slot.

9. The CMOS output stage of claim 8 wherein this metalized and oxidized slot also provides a thick metal for the CMOS output to provide a short between the two drains.

10. The CMOS output stage of claim 2 for providing a shortened CMOS device with heavy metal oxidized slots providing the shortening resulting in lowered Ron, lowered capacitance, reduced area and higher speed.

11. The CMOS output stage of claim 5 for providing a shortened CMOS device with heavy metalized slots providing the shortened device and result in lowered Ron, lowered capacitance, reduced area and higher speed.

12. The CMOS output stage of claim 10 in which the shortening by thickly metalized slots provides improved protection against electromigration.

13. The CMOS output stage of claim 12 in which the heavy metal provided within the slot for allowing the metal to contact the silicon substrate with ten times the heat transfer capability of oxide.

14. The CMOS output stage of claim 12 in which the heavy metal provided within the slot for allowing the metal to contact oxide with twenty times the heat transfer capability of air.

15. The CMOS output stage of claim 5 wherein the die size of the output stage is minimized based upon the shortening of both ends of the at least two wells and the on resistance (Ron) of the output stage is reduced.

16. The CMOS output stage of claim 15 wherein a current path from the at least two wells to the epitaxial or substrate is eliminated due to the oxidized slot.

17. The CMOS output stage of claim 15 wherein the snap back voltage and sustaining current is increased due to elimination of the current path through the wells to the epitaxial material or substrate.

18. The CMOS output stage of claim 1 wherein the ground power bus is not oxidized at the interface between the metal and the substrate.

19. The CMOS output stage of claim 1 wherein the metal is provided in the slots via a CVD metal deposition process.

20. A system for providing a CMOS output stage comprising:
  means for providing a substrate;
  means for providing at least two wells above the substrate;
  means for providing a plurality of slots through the at least two wells into the substrate;
  means for oxidizing each of the plurality of slots; and
  means for filling each of the plurality of slots with a metal to provide a plurality of power busses wherein each of the plurality of slots are filled with metal to provide a plurality of power busses; wherein one of the power busses provides a ground, one of the power busses provides an output and one of the power busses provides a power connector.

21. The system of claim 20 wherein the metal filling means is performed via a CVD metal deposition process.

22. The system of claim 20 wherein the metal filling means is performed by applying the metal in layers and planarizing the metal between layers by photoresist planarizing to remove the field metal and leave metal in the slots.

23. The system of claim 20 wherein the ground power buss is not oxidized at the bottom.

24. The system of claim 20 wherein the ends of the at least two wells can be shortened.

25. The system of claim 24 wherein the at least two wells are in close proximity to each other.

26. The system of claim 25 wherein the die size at the output stage is minimized based upon the shortened ends of the at least two wells and the on resistance (Ron) of the output stage is reduced.

27. The system of claim 26 wherein a current path from the at least two wells to the substrate is eliminated due to the oxidized slot.

* * * * *